United States Patent
Hung et al.

(10) Patent No.: US 8,564,103 B2
(45) Date of Patent: Oct. 22, 2013

(54) METHOD OF MANUFACTURING AN ELECTRONIC DEVICE

(75) Inventors: Bin-Yuan Hung, Hsin-Chu (TW); Sung-Hui Huang, Dongshan Township (TW); Wen Ting Tsai, Taipei (TW); Dian-Hau Chen, Hsin-Chu (TW); Ching Wei Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 294 days.

(21) Appl. No.: 12/727,904

(22) Filed: Mar. 19, 2010

(65) Prior Publication Data

US 2010/0308444 A1 Dec. 9, 2010

Related U.S. Application Data

(60) Provisional application No. 61/184,239, filed on Jun. 4, 2009.

(51) Int. Cl.
*H01L 21/00* (2006.01)

(52) U.S. Cl.
USPC .................... 257/622; 257/467; 257/774

(58) Field of Classification Search
USPC .......................... 257/622, 467, 774
See application file for complete search history.

(56) References Cited

U.S. PATENT DOCUMENTS

| | | | | |
|---|---|---|---|---|
| 5,614,765 A * | 3/1997 | Avanzino et al. | ............ | 257/774 |
| 5,863,707 A * | 1/1999 | Lin | ............... | 430/313 |
| 6,088,258 A * | 7/2000 | Aitken et al. | ............... | 365/149 |
| 6,159,787 A * | 12/2000 | Aitken et al. | ............... | 438/243 |
| 6,232,171 B1 * | 5/2001 | Mei | ............... | 438/246 |
| 6,239,473 B1 * | 5/2001 | Adams et al. | ............... | 257/419 |
| 6,342,430 B1 * | 1/2002 | Adams et al. | ............... | 438/424 |
| 6,428,713 B1 * | 8/2002 | Christenson et al. | ............ | 216/2 |
| 6,495,411 B1 * | 12/2002 | Mei | ............... | 438/239 |
| 6,703,273 B2 * | 3/2004 | Wang et al. | ............... | 438/243 |
| 6,849,554 B2 * | 2/2005 | Rattner et al. | ............... | 438/706 |
| 6,859,300 B2 * | 2/2005 | Greywall | ............... | 359/291 |
| 6,969,686 B2 * | 11/2005 | Hsieh et al. | ............... | 438/723 |
| 7,045,421 B2 * | 5/2006 | Rueckes et al. | ............... | 438/257 |
| 7,186,660 B2 * | 3/2007 | Panda et al. | ............... | 438/710 |
| 7,563,714 B2 * | 7/2009 | Erturk et al. | ............... | 438/675 |
| 7,633,165 B2 * | 12/2009 | Hsu et al. | ............... | 257/763 |
| 7,800,234 B2 * | 9/2010 | Marchi et al. | ............... | 257/774 |
| 7,851,923 B2 * | 12/2010 | Erturk et al. | ............... | 257/773 |
| 8,008,160 B2 * | 8/2011 | Cheng et al. | ............... | 438/389 |
| 8,163,629 B2 * | 4/2012 | Schuderer et al. | ............ | 438/462 |
| 2001/0044165 A1 * | 11/2001 | Lee et al. | ............... | 438/52 |
| 2002/0079522 A1 * | 6/2002 | Diodato et al. | ............... | 257/296 |
| 2002/0127760 A1 * | 9/2002 | Yeh et al. | ............... | 438/50 |
| 2004/0132312 A1 * | 7/2004 | Panda et al. | ............... | 438/710 |
| 2004/0175877 A1 * | 9/2004 | Lin et al. | ............... | 438/200 |
| 2005/0067633 A1 * | 3/2005 | Mushika | ............... | 257/202 |
| 2005/0101054 A1 * | 5/2005 | Mastromatteo et al. | ...... | 438/106 |

(Continued)

*Primary Examiner* — Laura Menz
(74) *Attorney, Agent, or Firm* — Slater & Matsil, L.L.P.

(57) ABSTRACT

In order to protect IMD layers, particularly low-k dielectrics, a protection film is formed on the sidewall of an opening in the IMD layers prior to etching a trench in the underlying silicon substrate. After etching the trench, such as through a TMAH wet etch, at least part of the protection film can be removed. The protection film can be removed in an anisotropic etch process such that a portion of the protection film remains as a sidewall spacer on the sidewall of the opening within the IMD layers.

13 Claims, 9 Drawing Sheets

(56) References Cited

U.S. PATENT DOCUMENTS

Figure 1:
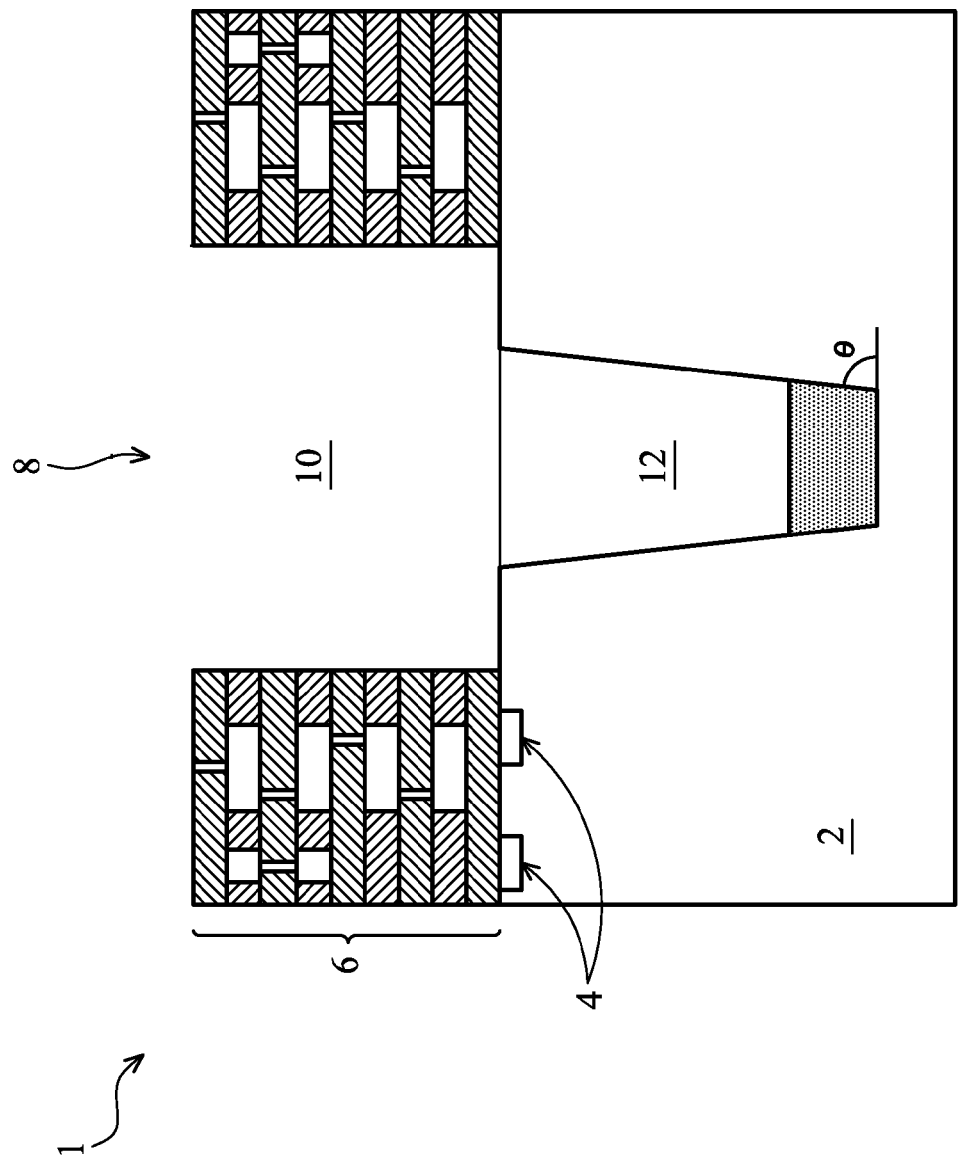

| Publication No. | Date | Inventor | Class |
|---|---|---|---|
| 2005/0221616 A1* | 10/2005 | Chen et al. | 438/700 |
| 2007/0190692 A1* | 8/2007 | Erturk et al. | 438/118 |
| 2008/0099860 A1* | 5/2008 | Wuertz | 257/415 |
| 2008/0197512 A1* | 8/2008 | Marchi et al. | 257/784 |
| 2009/0160061 A1* | 6/2009 | Hsu et al. | 257/763 |
| 2009/0174082 A1* | 7/2009 | Leedy | 257/777 |
| 2009/0184392 A1* | 7/2009 | Cheng et al. | 257/532 |
| 2009/0296307 A1* | 12/2009 | Siamak et al. | 361/281 |
| 2010/0133660 A1* | 6/2010 | Huyghebaert et al. | 257/621 |
| 2010/0155908 A1* | 6/2010 | Shiu | 257/635 |
| 2010/0171225 A1* | 7/2010 | Leedy | 257/773 |
| 2010/0230736 A1* | 9/2010 | Zhu et al. | 257/301 |
| 2010/0230779 A1* | 9/2010 | Anderson et al. | 257/516 |
| 2010/0248487 A1* | 9/2010 | Lee et al. | 438/706 |
| 2010/0308444 A1* | 12/2010 | Hung et al. | 257/622 |
| 2011/0018095 A1* | 1/2011 | Booth et al. | 257/532 |
| 2011/0062555 A1* | 3/2011 | Fried et al. | 257/595 |
| 2011/0068398 A1* | 3/2011 | Anderson et al. | 257/347 |
| 2011/0133310 A1* | 6/2011 | Anderson et al. | 257/532 |
| 2011/0136283 A1* | 6/2011 | Gritters et al. | 438/50 |
| 2011/0201171 A1* | 8/2011 | Disney et al. | 438/404 |
| 2011/0217832 A1* | 9/2011 | Raorane et al. | 438/589 |
| 2011/0281416 A1* | 11/2011 | Hashimoto et al. | 438/424 |
| 2012/0025199 A1* | 2/2012 | Chen et al. | 257/75 |
| 2012/0091593 A1* | 4/2012 | Cheng et al. | 257/774 |
| 2012/0129291 A1* | 5/2012 | Stahl et al. | 438/50 |
| 2012/0133023 A1* | 5/2012 | Booth et al. | 257/532 |
| 2012/0181665 A1* | 7/2012 | Kwon | 257/618 |
| 2012/0190204 A1* | 7/2012 | Graves-Abe et al. | 438/702 |
| 2012/0193785 A1* | 8/2012 | Lin et al. | 257/737 |
| 2012/0196424 A1* | 8/2012 | Krishnan et al. | 438/387 |
| 2012/0205781 A1* | 8/2012 | Fried et al. | 257/595 |

\* cited by examiner

METHOD OF MANUFACTURING AN ELECTRONIC DEVICE

This application claims the benefit of U.S. Provisional Patent Application Ser. No. 61/184,239, filed on Jun. 4, 2009, and entitled "Method of Manufacturing an Electronic Device," which application is incorporated herein by reference.

TECHNICAL FIELD

This invention relates to MEMS (microelectromechanical systems) structures and methods of forming same, and more particularly to a method of forming a deep trench in a semiconductor substrate and structures resulting from same.

BACKGROUND

MEMS devices are becoming increasingly prevalent as new and additional applications are developed employing MEMS technology. In many applications, it is important that the manufacturing process for forming the MEMS structure is compatible with integrated circuit manufacturing processes, particularly CMOS (complimentary metal-oxide-semiconductor) manufacturing processes. This is particularly so as, in many applications, MEMS devices are formed simultaneously with formation of CMOS devices, or at least formed on the substrate as CMOS devices.

As CMOS technology develops, such as the push toward low k and extreme low k (ELK) dielectrics, new manufacturing processes must be developed to optimize the compatibility between the CMOS manufacturing steps and the commensurate MEMS manufacturing processes.

SUMMARY OF THE INVENTION

In a first aspect, the present invention provides for a method of manufacturing an electronic device comprising forming an electronic component on a substrate, and forming an interconnection layer above the electronic component, the interconnection layer including at least one dielectric layer. The method further includes forming an opening in the interconnection layer and exposing a portion of the substrate, and depositing a film along a sidewall of the opening and on the substrate. The method also includes forming an opening in the film to expose a portion of the substrate, forming a deep trench in the substrate, and removing at least part of the film.

In another aspect, the present invention provides for an electronic device comprising a substrate, and a plurality of dielectric layers on the substrate. At least one of the plurality of dielectric layers has a conductive interconnect embedded therein. The electronic device further includes an opening in the plurality of dielectric layers extending from a top dielectric layer through to the substrate, and a deep trench in the substrate, the deep trench being in communication with, that is open to, the opening. The electronic device also includes a dielectric sidewall spacer on a sidewall of the opening in the plurality of dielectric layers.

In yet another aspect, the present invention provides for an electronic system. The electronic device system includes a first device and a second device. The first device comprises a substrate, interconnection layers formed atop the substrate and including at least one low-k dielectric layer, an opening formed in the interconnection layers and open to a trench formed within the substrate, and a dielectric film formed along a sidewall of the opening.

The second device comprises a second substrate, second interconnection layers formed atop the substrate and including at least one second low-k dielectric layer, a second opening formed in the second interconnection layers and communicating with a second trench formed within the second substrate, and a second dielectric film formed along a sidewall of the second opening. The first and second devices are aligned such that the first opening and second opening and the first trench and second trench are aligned. The electronic system also includes a spacer extending from within the first trench to within the second trench.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates an exemplary device in which electronic devices, such as CMOS devices, are manufactured on a common substrate with MEMS devices;

FIGS. 2*a* through 2*g* illustrate various stages in the manufacture of an illustrative embodiment electronic device employing aspects of the present invention; and FIG. 3 illustrates an exemplary electronic system employing aspects of the present invention.

DETAILED DESCRIPTION OF ILLUSTRATIVE EMBODIMENTS

The making and using of the illustrative embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 illustrates an exemplary device 1 in which electronic devices, such as CMOS devices, are manufactured on a common substrate with MEMS devices. Device 1 is shown in an intermediate stage of manufacture. Exemplary device 1 includes a substrate 2 upon and in which are formed various electronic components 4 (e.g., PMOS transistors, NMOS transistors, capacitors, resistors, and the like). The various electronic components are interconnected and connected to other components external to device 1 through multiple layers of interconnections 6. In an illustrative embodiment, interconnections 6 are one or more conductive layers formed within one or more dielectric layers. For example, each such conductive layer could be a copper conductor embedded within an inter-metal dielectric (IMD) layer, formed using well known damascene processes. As is also known, the top most conductive layer could include bond pads (for connection to external devices) and a passivation formed thereover. For simplicity, conductive layers, IMD layers, bond pad layers, passivation layers are collectively referred to as interconnections 6 in FIG. 1.

Opening 8 is also illustrated in FIG. 1. Opening 8 includes an opening 10 formed within interconnections layers 6 and a deep trench 12 formed within substrate 2. Opening 8 could be employed as part of a MEMS device, could be employed for mechanically aligning and interconnecting two separate devices 1, or other application. Regardless of the application, it is often desirable to control the angle Φ of the sidewall of deep trench 12. It is also generally desirable to form deep trench 12 quickly from a manufacturing efficiency perspective.

In an exemplary manufacturing process, substrate 2 is a silicon substrate and deep trench 12 is formed by a wet etching process using TMAH (Tetramethylammonium hydroxide) etchant. Typically, TMAH etches through silicon substrate 2 at roughly 0.8μ/min under standard etch processing parameters. It has been noted, however, that when low-k dielectrics, such as carbon doped silicon oxide (frequently referred to as Black Diamond, available from Applied Materials, Santa Clara, Calif.), fluorine doped silicon glass (FSG), porous low-k films, and the like are employed in interconnection layers 6, the presence of these low-k dielectric layers may significantly reduce the etch rate of silicon substrate 2. Low-k is a term of art that generally refers to a dielectric having a dielectric constant less than that of silicon oxide, i.e., less than about 3.9. In some instances, it has been noted that the etch rate degrades from about 0.8μ/min in the presence of conventional dielectrics (e.g., FSG) to about 0.022μ/min in the presence of low-k dielectrics. Because deep trench 12 may be as much as 1-1000μ deep, this degradation of etching rate can significantly increase manufacturing time and hence the overall manufacturing costs of device 1.

Another adverse consequence that may result from the manufacture of opening 8 is that the opening 10 formed within interconnections layer 6 is formed using standard photolithography processes, including the deposition, patterning, and subsequent removal of one or more photoresist layers (not shown) on device 1. Because deep trench 12 is desirably relatively deep with a relatively narrow mouth, residual photoresist material may remain in the bottom of deep trench 12 despite efforts to remove all photoresist material from device 1. This can adversely impact subsequent manufacturing steps and can materially affect the performance of device 1.

Figure 2A:
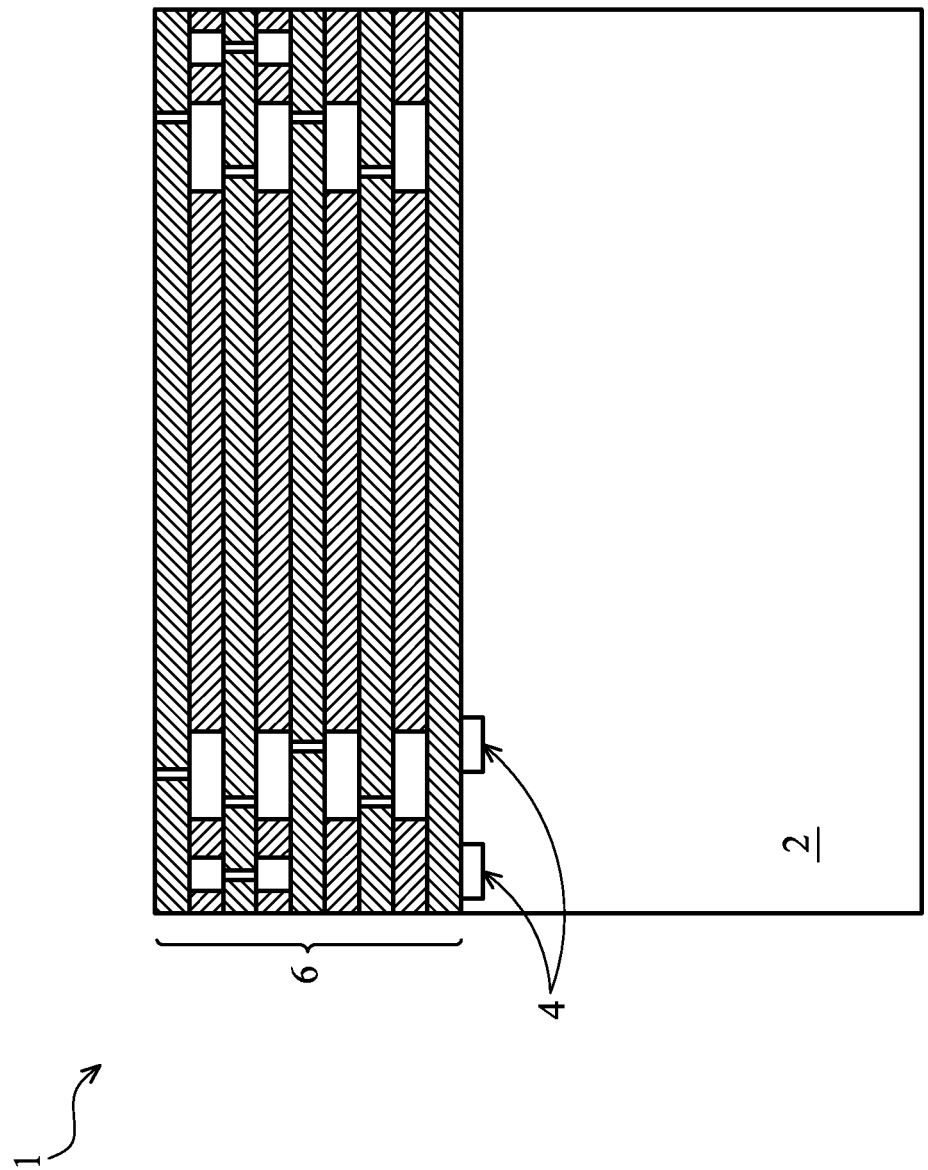

FIG. 2a illustrates device 1 in an earlier stage of manufacture (relative to FIG. 1). As shown in FIG. 2a, electronic components 4 have been formed in and on substrate 2 using known processes, such as known CMOS manufacturing techniques. Interconnections layers 6 have been formed over electronic components, such as through known dual-damascene or single damascene process in which conductive wires and vias are formed within respective low-k dielectric layers. Bond layer and passivation layers are also formed and patterned using conventional techniques. At the stage of manufacture illustrated in FIG. 2a, the CMOS components of device 1 are effectively complete.

Figure 2B:
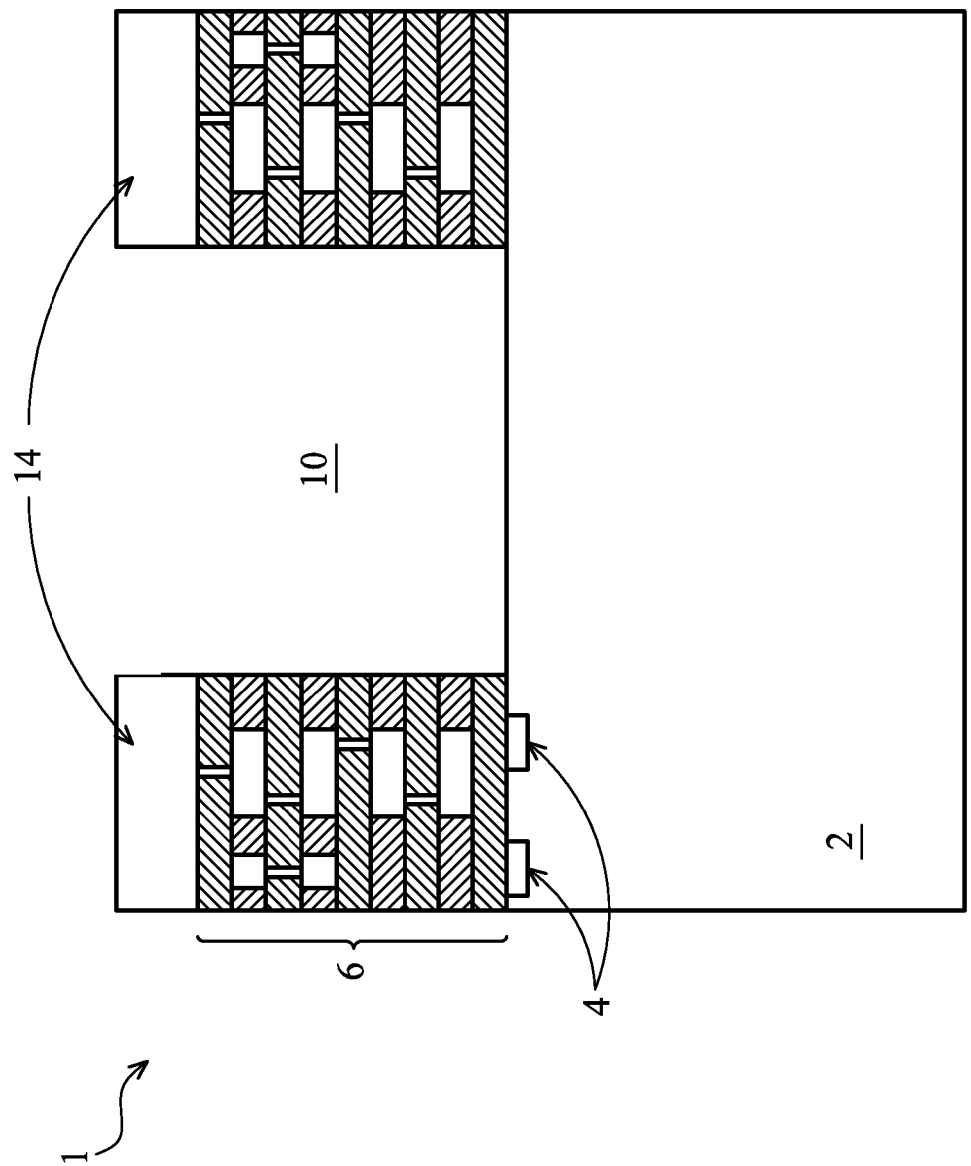

FIG. 2b illustrates a subsequent step in the formation of opening 8. As illustrated, a photoresist layer 14 is formed and patterned atop device 1. Using patterned photoresist layer 14 as a mask, opening 10 is formed within (i.e., through) interconnections layers 6. In an illustrative embodiment, opening 10 is formed by a dry etch process such as exposure to, e.g., $CF_4$, $CHF_3$, and the like, in an appropriate etch chamber.

After opening 10 is formed, photoresist layer 14 is removed, such as by a conventional ashing technique, also referred to as an oxide plasma removal. Note that because photoresist layer 14 is removed prior to the formation of deep trench 12, the risk of residual photoresist material remaining at the bottom of deep trench 12 is eliminated.

Figure 2C:
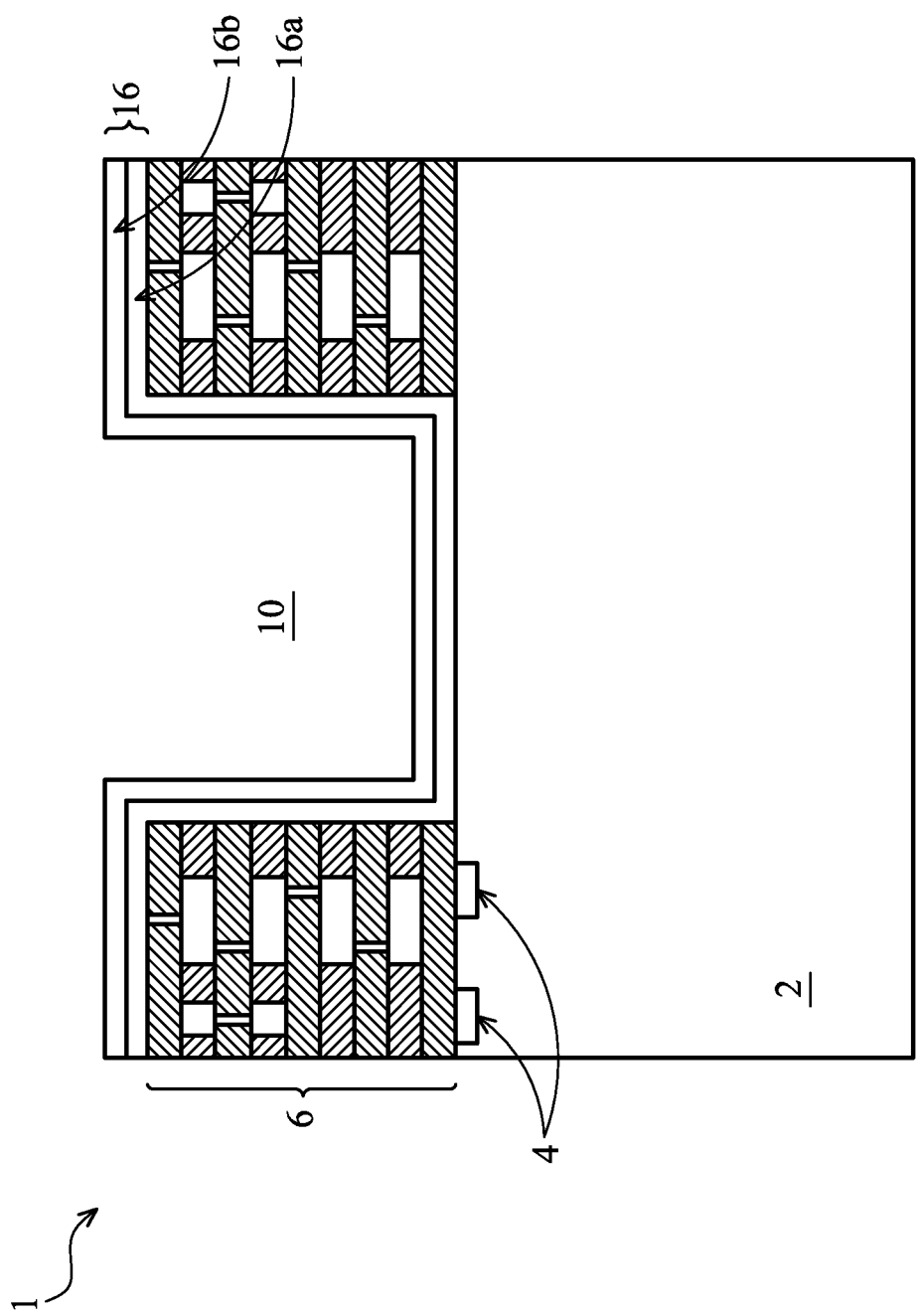

In order to protect the IMD dielectric layers, which in the illustrated embodiments are ELK dielectrics, a sidewall protection film 16 is formed, as illustrated in FIG. 2c. In an illustrative embodiment, sidewall protection film is a composite film of an oxide layer 16a and a nitride layer 16b. Oxide layer 16a may be formed using conventional chemical vapor deposition (CVD) techniques and deposited to a thickness of from about one to about twenty microns. One skilled in the art will recognize that other deposition techniques, such as TEOS, high pressure CVD (HPVCD), and the like could alternatively be employed to form oxide layer 16a. In various embodiments, oxide layer 16a acts as a buffer layer between the dielectric layers of interconnections layers 6 and nitride layer 16b to reduce or eliminate stress that would otherwise arise at the interface between the dielectric layers and nitride layer 16b. This eliminates or reduces the risk of damage to or delamination of the dielectric layers.

Nitride layer 16b may also be formed using a convention CVD deposition process, or plasma enhanced CVD (PECVD), low pressure CVD (LPCVD), or other known deposition technique. Nitride layer 16b may be deposited to a thickness of from about one to about twenty microns. Nitride layer 16b is a silicon nitride in the illustrated example and provides the advantageous feature of high etch selectivity relative to substrate 2, as will be described further below. In other embodiments, SiON, SiCN, SiC, or other materials and combinations of materials could be used for nitride layer 16b, as could other materials provided they provide sufficient etch selectivity relative substrate 2.

Figure 2D:
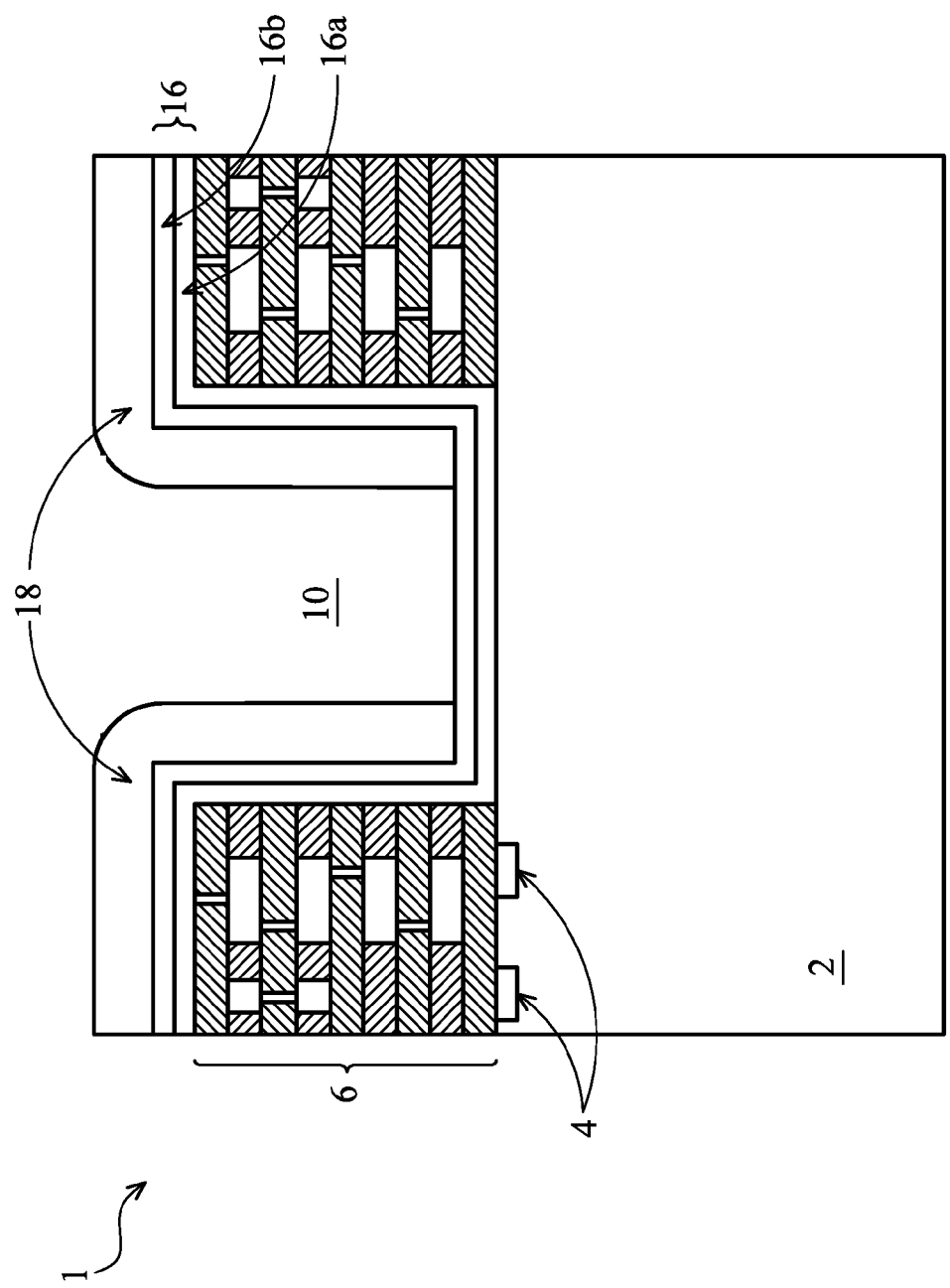
Figure 2E:
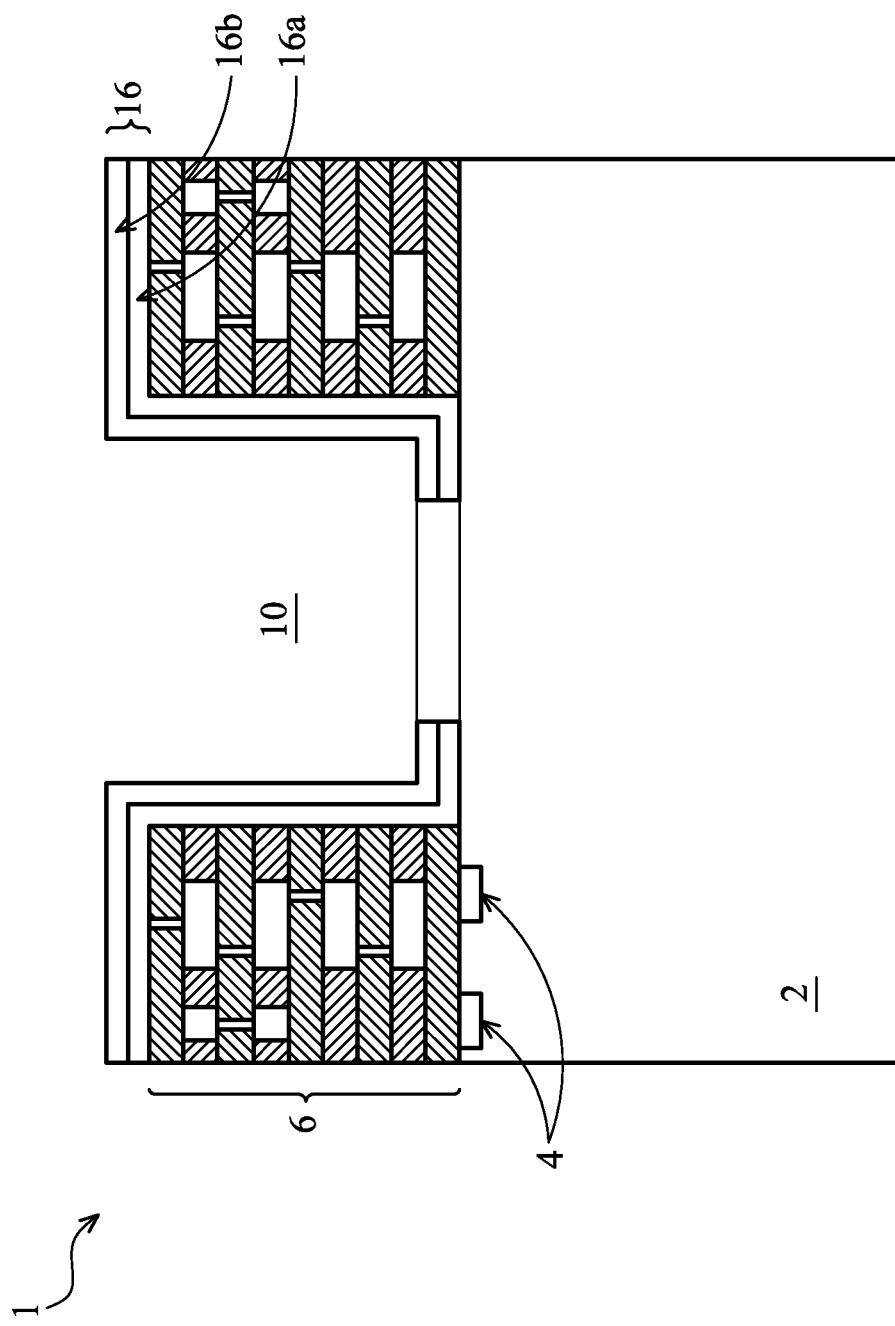

A second photoresist layer 18 is next formed over device 1, as illustrated in FIG. 2d. Using conventional photolithography processes, photoresist layer 18 is patterned to expose sidewall protection film 16 at the bottom of opening 10. This portion of sidewall protection film 16 is removed in order to expose and then etch substrate 2 to form deep trench 12, as described more fully below. Using a conventional dry etching process, such as a passivation dry etch, the nitride layer if first removed (e.g., using a first etch recipe and process) and then the underlying oxide is removed (e.g., using a second etch recipe and process that is tuned to the oxide layer). FIG. 2e illustrates device 1 after photoresist layer 18 has been removed, such as by an oxide plasma or ashing process. At this stage, sidewall protection film 16 remains on the sidewalls of opening 10 and also remains on those portions of substrate 2 at the bottom of opening 10 that were previously covered by photoresist layer 18. In this example, sidewall protection film 16 also acts as a hard mask for defining the dimensions of (subsequently formed) deep trench 12.

Figure 2F:
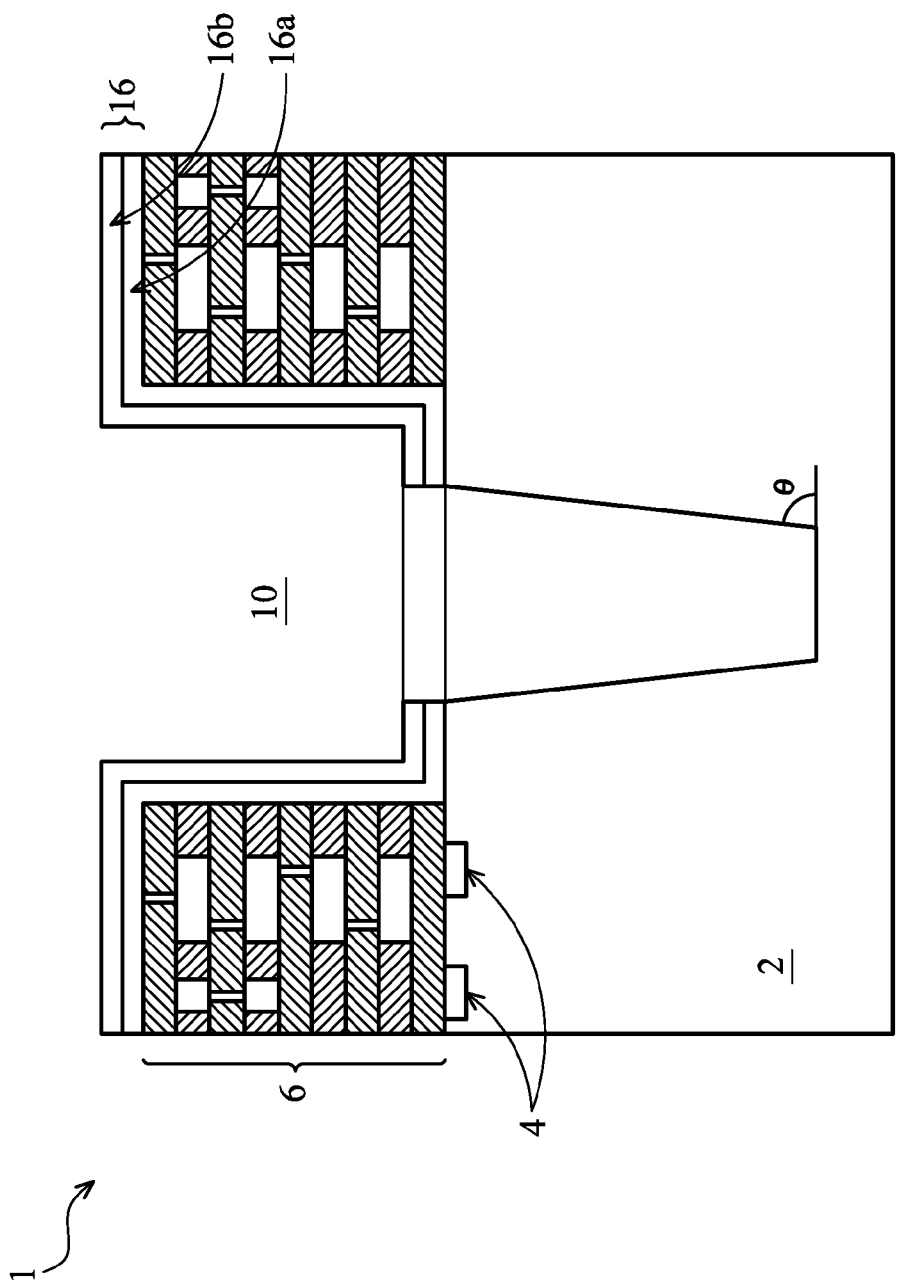

FIG. 2f illustrates device 1 after deep trench 12 has been formed in substrate 2. In the illustrated embodiment, deep trench 12 is formed by a wet etch process using TMAH. In an exemplary embodiment, device 1 is dipped into a solution of TMAH having a concentration of from about 1% to about 35% at a temperature of from about 30 C to about 100 C. One skilled in the art will recognize that a wet TMAH etch is an isotropic etch and hence sidewalls of deep trench 12 will be formed with an angle Φ relative to a major surface of substrate 2. The value of angle Φ can be controlled by adjusting the concentration of TMAH, the temperature of the solution, and the duration of the etch process. An angle Φ of from about 40° to about 65° may be advantageous for several applications. In various embodiments such an angle can be readily obtained by adjusting the above described parameters. Likewise, in some embodiments, a critical dimension CD, as illustrated in FIG. 2f, could be readily obtained using the above described etch process. Note that the presence of sidewall protection film 16 during the wet etch process should advantageously reduce or eliminate damage to or delamination of dielectric layers in interconnections layers 6. Note further that deep trench 12 is in communication with opening 10, meaning they are open to each other.

Figure 2G:
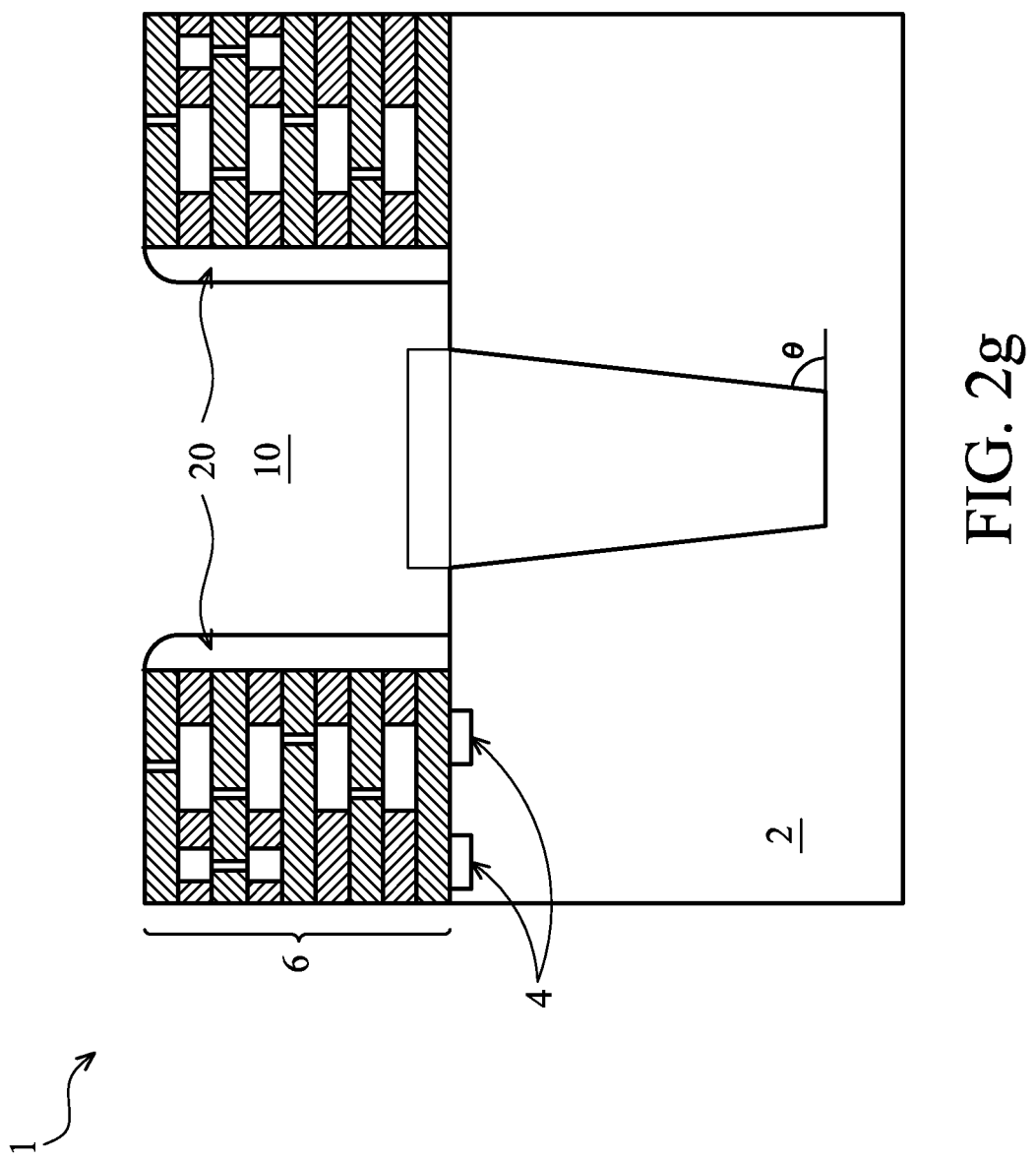

As illustrated in FIG. 2g, sidewall protection film can be substantially removed after formation of deep trench 12. In some embodiments, sidewall protection film 16 could be completely removed. In the illustrated embodiment, however, sidewall protection film 16 is removed using an anisotropic etching technique which removes the film from horizontal surfaces (such as atop interconnections layers 6 and the top surface of substrate 2), while leaving the film intact on vertical surfaces (such as the sidewalls of opening 10). Techniques for anisotropically removing an oxide, a nitride, or a composite oxide/nitride film are well known in the art in order to achieve so-called sidewall spacers such as are commonly formed on CMOS transistor gates. As one skilled in the art will readily appreciate, those teachings can be applied to etching sidewall protection film 16 in order to form sidewall spacers 20 as shown in FIG. 2g. Two advantages may be realized by leaving sidewall spacers 20 intact. First, there is substantial risk of damaging the dielectric layers of interconnections layers 6 associated with removing sidewall protection film from the sidewalls of opening 10. Recall that sidewall protection film 16 may include an underlying oxide layer 16a; removing this oxide layer raises a significant risk of inadvertently etching back or otherwise damaging the material of the dielectric layers of interconnections layers 6. Leaving sidewall protection film 16 intact on the sidewalls reduces this risk. Second, by leaving sidewall spacers 20 may also serve to protect dielectric layers of interconnections layers 6 during subsequent processing, and may, in fact, provide structure support to the dielectric layers as well.

Figure 3:
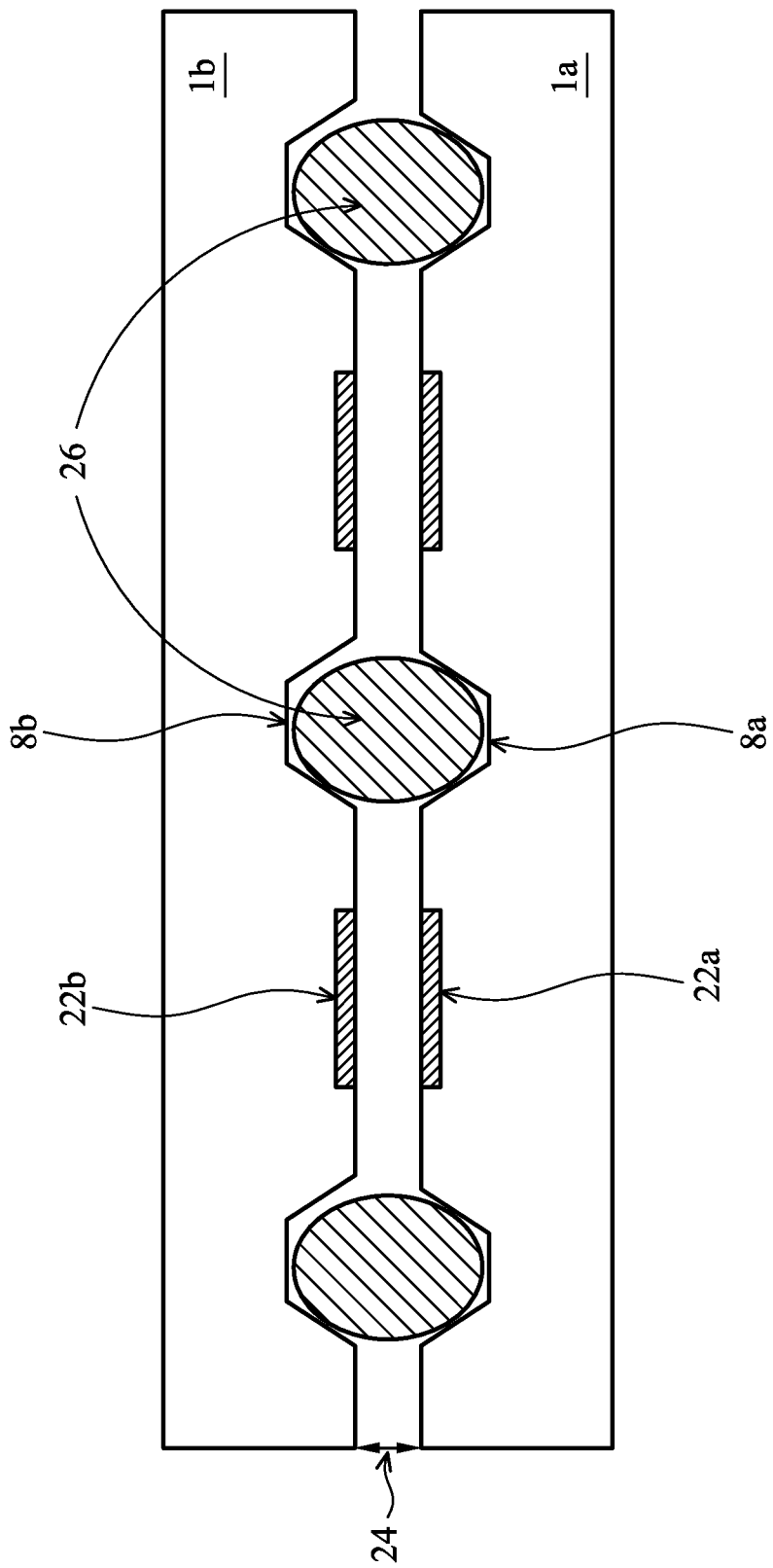

FIG. 3 illustrates an application employing two devices 1a and 1b having been manufactured as described above. In the illustrated application devices 1a and 1b are electrically interconnect using capacitive coupling through signal pads 22a on device 1a and corresponding signal pads 22b on device 1b. In order for effective capacitive coupling of the devices, an air gap 24 in various embodiments is carefully maintained. As shown, spacer ball 26 is one way to maintain an appropriate spacing or air gap between devices. A first opening 8a is formed in device 1a using the above described techniques and a corresponding opening 8b is formed in device 1b also using the above described techniques. Spacer ball 26 is formed or deposited within first opening 8a. When device 1a and 1b are brought into alignment with one another, spacer ball 26 fits within both opening 8a and opening 8b, and extends above and beyond each opening 8a and 8b. By careful control of the CD and the depth of opening 8a and 8b and the diameter of spacer ball 26, precise control of the air gap 24 between devices 1a and 1b can be obtained and maintained.

Although the present invention and its advantages have been described in detail, it should be understood that various changes, substitutions and alterations can be made herein without departing from the spirit and scope of the invention as defined by the appended claims. For example, many of the features and process steps discussed above can be implemented using conventional CMOS processes or using other semiconductor manufacturing processes.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electronic device comprising:
   a substrate;
   a plurality of dielectric layers on the substrate, at least one of the plurality of dielectric layers having a conductive interconnect embedded therein;
   an opening in the plurality of dielectric layers extending from a top dielectric layer through to the substrate;
   a deep trench in the substrate, the deep trench being open to the opening; and
   a dielectric sidewall spacer only on a sidewall of the opening in the plurality of dielectric layers.

2. The electronic device of claim 1 wherein the dielectric sidewall spacer comprises a nitride layer overlying an oxide layer.

3. The electronic device of claim 1 wherein at least one of the plurality of dielectric layers comprises a low-k dielectric layer.

4. The electronic device of claim 1 further comprising a spacer ball located within the deep trench and extending above and beyond the deep trench.

5. The electronic device of claim 1 wherein the dielectric sidewall spacer comprises at least one material selected from the group consisting essentially of SiN, SiON, SiC, and SiCN, and SiO2.

6. The electronic device of claim 1 wherein the deep trench has a sidewall having an angle of between 40 and 65 degrees, relative to a major top surface of the substrate.

7. The electronic device of claim 1 wherein the substrate comprises silicon.

8. The electronic device of claim 1 further comprising a signal pad atop the plurality of dielectric layers.

9. The electronic device of claim 1, further comprising:
   a second substrate;
   a second plurality of dielectric layers on the second substrate, at least one of the second plurality of dielectric layers having a second conductive interconnect embedded therein;
   a second opening in the second plurality of dielectric layers extending from a second top dielectric layer through to the second substrate;
   a second deep trench in the second substrate, the second deep trench being open to the second opening;
   a second dielectric sidewall spacer only on a second sidewall of the second opening in the second plurality of dielectric layers;
   the substrate and the second substrate being aligned such that the opening and the second trench are aligned; and
   a spacer extending from within the deep trench to within the second deep trench.

10. The electronic device of claim 9 further comprising a signal pad on the substrate and a corresponding second signal pad on the second substrate.

11. The electronic device of claim 10 wherein the signal pad and corresponding second signal pad are capacitively coupled.

12. The electronic device of claim 9 wherein the opening and the second opening have respective diameters of between about 10μ and about 1,000μ.

13. The electronic system of claim 9 wherein the trench and the second trench include respective sidewalls having an angle of between about 40 and about 65 degrees relative to a major top surface of the respective substrate and the second substrate.

* * * * *